(12) United States Patent
Gao et al.

(10) Patent No.: US 10,526,495 B2
(45) Date of Patent: Jan. 7, 2020

(54) ELECTRICAL DEVICES AND COMPONENTS USED IN ELECTRICAL SYSTEMS MADE WITH SELF-HEALING MATERIALS

(71) Applicant: Thomas & Betts International LLC, Wilmington, DE (US)

(72) Inventors: Yan Gao, Memphis, TN (US); Mark Drane, Collierville, TN (US); Cong Thanh Dinh, Collierville, TN (US); Ronald White, Germantown, TN (US); Ian Rubin de la Borbolla, Memphis, TN (US)

(73) Assignee: ABB Schweiz AG, Baden (CH)

( * ) Notice: Subject to any disclaimer, the term of this patent is extended or adjusted under 35 U.S.C. 154(b) by 83 days.

(21) Appl. No.: 15/543,464

(22) PCT Filed: Jan. 14, 2016

(86) PCT No.: PCT/US2016/013411
§ 371 (c)(1),
(2) Date: Jul. 13, 2017

(87) PCT Pub. No.: WO2016/115348
PCT Pub. Date: Jul. 21, 2016

(65) Prior Publication Data
US 2018/0002544 A1    Jan. 4, 2018

Related U.S. Application Data

(60) Provisional application No. 62/104,385, filed on Jan. 16, 2015.

(51) Int. Cl.
| C09D 5/00 | (2006.01) |
| C09D 175/02 | (2006.01) |
| H01R 13/00 | (2006.01) |
| H01R 12/00 | (2006.01) |

(Continued)

(52) U.S. Cl.
CPC ......... *C09D 5/4419* (2013.01); *C09D 5/4423* (2013.01); *C09D 5/4461* (2013.01); *C09D 175/02* (2013.01); *C09D 175/04* (2013.01)

(58) Field of Classification Search
None
See application file for complete search history.

(56) References Cited

U.S. PATENT DOCUMENTS

| 10,000,608 B2* | 6/2018 | Cheng ................. C08G 18/73 |
| 2007/0166542 A1* | 7/2007 | Braun ................. B29C 73/163 |
| | | 428/402.21 |

(Continued)

FOREIGN PATENT DOCUMENTS

| CN | 101469133 A | 7/2009 |
| CN | 101508823 A | 8/2009 |

(Continued)

OTHER PUBLICATIONS

International Search Report and Written Opinion issued in corresponding international application No. PCT/US2016/013411, dated May 5, 2016, 9 pp.

(Continued)

*Primary Examiner* — Peter A Salamon
(74) *Attorney, Agent, or Firm* — Taft Stettinius & Hollister LLP; J. Bruce Shhelkopf

(57) ABSTRACT

Self-healing polymers used to fabricate electrical devices or to coat electrical devices that have a metal or polymer substrate. The self-healing polymers can be made from modified polymers including polyurethanes, polyureas, polyamides and polyesters and, optionally, cross-linking agents and one or more catalysts. The self-healing polymers can be used to make cable ties, tape, conduit fittings and explosion-proof sealant materials.

6 Claims, 8 Drawing Sheets

(51) Int. Cl.
*C09D 5/44* (2006.01)
*C09D 175/04* (2006.01)

(56) References Cited

U.S. PATENT DOCUMENTS

| | | | | |
|---|---|---|---|---|
| 2009/0294022 A1* | 12/2009 | Hayes | ................ | G01N 27/041 |
| | | | | 156/94 |
| 2010/0028683 A1 | 2/2010 | Xie et al. | | |
| 2011/0147043 A1* | 6/2011 | Perry | .................... | H02K 3/30 |
| | | | | 174/119 C |
| 2012/0321828 A1* | 12/2012 | Jolley | .............. | C08G 18/5024 |
| | | | | 428/36.6 |
| 2013/0337023 A1* | 12/2013 | Lei | ......................... | A61K 8/11 |
| | | | | 424/401 |
| 2014/0039119 A1* | 2/2014 | Hong | ................... | B82Y 30/00 |
| | | | | 524/590 |

FOREIGN PATENT DOCUMENTS

| | | |
|---|---|---|
| CN | 202422796 U | 9/2012 |
| WO | 2009/115671 A1 | 9/2009 |
| WO | 2014/144539 A2 | 9/2014 |

OTHER PUBLICATIONS

International Preliminary Report on Patentability issued in corresponding international application No. PCT/US2016/013411, dated Jul. 18, 2017, 6 pp.
European Search Report issued in corresponding European application No. 16737881.9, dated Jun. 6, 2018, 6 pp.

* cited by examiner

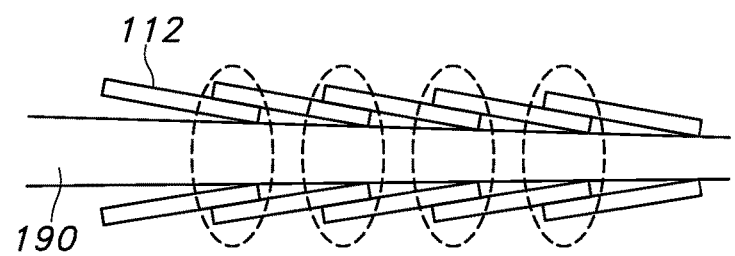
FIG. 2B
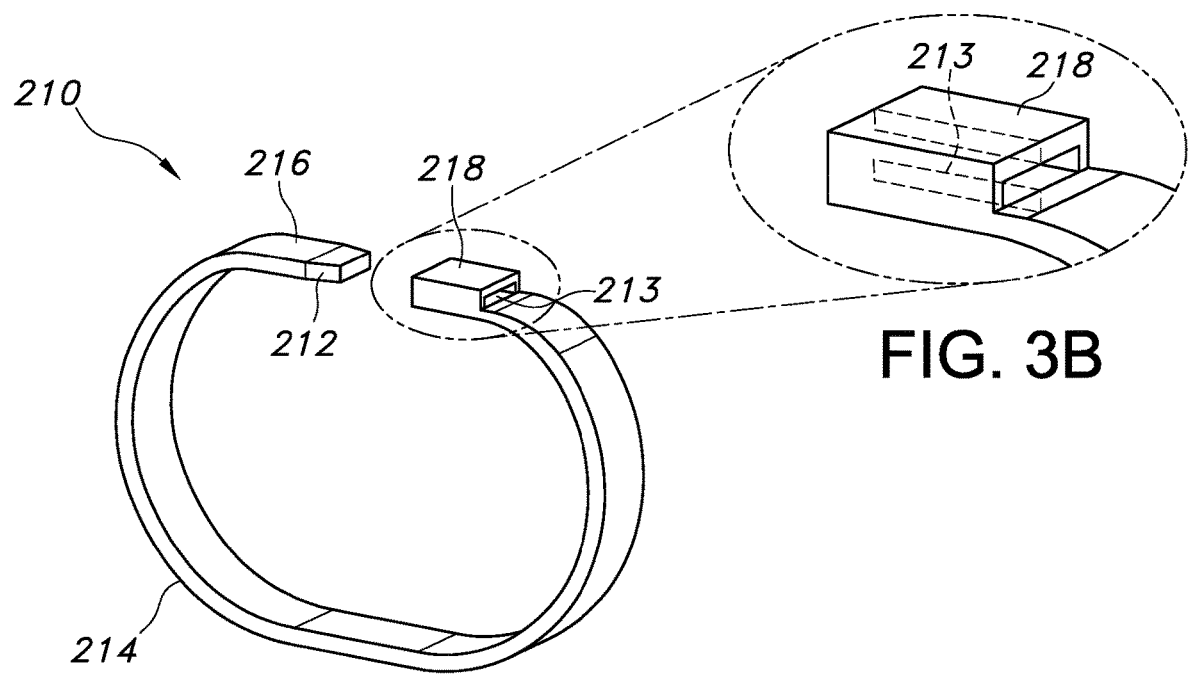
FIG. 3B
FIG. 3A

ELECTRICAL DEVICES AND COMPONENTS USED IN ELECTRICAL SYSTEMS MADE WITH SELF-HEALING MATERIALS

This application is the U.S. National phase of, and claims priority from, International Patent Application No. PCT/US2016/013411, filed on Jan. 14, 2016, which claims priority from provisional application Ser. No. 62/104,385, filed on Jan. 16, 2015, each of which is incorporated herein by reference in its entirety.

FIELD OF THE INVENTION

The present invention is a self-healing polymer material that can be molded, extruded or used as a coating material for electrical devices and components used in electrical systems. In particular, the present invention relates to a self-healing polymer material used as a bonding, sealing or coating material in connection with electrical devices and components used in electrical systems.

BACKGROUND OF INVENTION

Self-healing polymers and fiber-reinforced polymer composites (also referred to herein as "smart" polymers or materials) possess the ability to heal in response to damage wherever and whenever it occurs in the material. The damage may be caused by fatigue, impact, puncture or corrosion. These polymers are classified into two categories: intrinsic self-healing ones that able to heal cracks by the polymers themselves, and extrinsic in which a healing agent has to be pre-embedded in the material. These smart materials, which can intrinsically correct damage caused by normal usage, are expected to lower costs of a number of different industrial processes through longer part lifetime, reduced maintenance and down-time, reduced inefficiency caused by degradation over time, as well as reduced replacement costs caused by failed material.

From a molecular perspective, traditional polymers fail through cleavage of covalent bonds in the polymers. While newer polymers can yield in other ways, traditional polymers typically yield through homolytic bond cleavage (where each of the fragments of a molecule retains one of the originally-bonded electrons) or heterolytic bond cleavage (where both of the electrons involved in the original molecular bond remain with only one of the fragment species). The energy needed to break the polymer bond can be provided via different formats including kinetic, electrical, mechanical, chemical, radiant and thermal. For example, the factors that can affect how a polymer will fail include: the type of stress, the molecular structure of the polymer and the macro-level properties exhibited by the polymerized material, as well as the level and type of external excitations including solvation (the process of attraction and association of molecules of a solvent with molecules or ions of a solute), radiation and temperature.

From a macromolecular (the very large molecule commonly created by polymerization of smaller subunits) perspective, stress induced damage at the molecular level leads to larger scale damage called micro-cracks. A micro-crack is formed where neighboring polymer chains have been damaged in close proximity, ultimately leading to the weakening of the polymeric material as a whole.

Plastic cable ties (also referred to herein as "cable fasteners") currently in use have two common forms: a two piece cable tie and a one piece cable tie. Typical two piece cable ties can include a plastic strap and a steel barb. When fastened around a bundle of wires, the steel barb engages the strap to lock the cable fastener and prevent its release. A one piece cable tie that is constructed entirely of plastic can include a plastic pawl that locks with the zig-zag surface of the strap to secure the cable tie after it is fastened. The steel barb is one main weakness of the two piece cable tie that contributes to its failure. It is known that the steel barb may bend backward to release the strap (a failure of the product) before the design strength is reached for the plastic strap. The plastic pawl of the one piece cable tie is also a main weakness. The plastic pawl can be ripped off its position to release the plastic strap. The detached plastic pawl also becomes a potential particle contaminant.

Electrical conduit is made of metal or non-metallic materials. Existing connections are threaded or use a set screw or other locking mechanism to secure the pipe to the fittings. Plastic or non-metallic connections can also be sealed using glue, an O-ring, sealant or solvents. Disadvantages of the current methods are that threads or mechanical connections may loosen over time or may be installed incorrectly. Solvents, an O-ring, sealant or glue are inconvenient to use and must be applied correctly to attain a good bond.

The heavy-duty corrosion-resistant electrical conduits and fittings currently in use are typically fabricated with metallic pipe and surface polymeric coatings. Current coating materials include polyvinyl chloride, epoxy resin, polyurea, polyurethane, polyester, acrylic derivative and modifications of these polymers. During the transportation, installation and operation of the conduit or fitting, the conduits and fittings may be damaged causing small cracks or cuts on the plastic surface. These small cracks and cuts are difficult to notice before a more severe problem occurs, such as corrosion of the metallic pipe. After the damage is identified, the repair requires a person to visit the location and manually replace or repair the conduit or fitting surface. Conventional coated conduits and fittings require extensive maintenance during the life of the product.

Explosion proof and/or hazardous location fittings currently being used typically use two part epoxy putty material as the sealant. One such filler material currently being used is CHICO® SS2 Speed Seal™ explosion-proof compound sold by Crouse-Hinds. Filled epoxy is a popular thermoset due to its high resistance to an explosion. To install the epoxy putty sealant, the two putty materials are mechanically mixed into a uniform composition. The mixed material is then cured into a polymerized form and function as a sealant. Typically, an ambient temperature of 25° C. or above is required to mix the two parts and to cure the mixed material. This temperature requirement poses a big challenge for the fitting products installed in cold outdoor environments. In one scenario, a heated tent is used in cold conditions to meet the temperature requirement. The hand mixing of the two putty materials is another labor intensive step in the installation. The uniformity of the mixture, which affects the resulting sealant performance, is difficult to achieve for two putty materials.

SUMMARY OF THE INVENTION

In accordance with the present invention, electrical devices made from or coated with a self-healing polymer are provided. The electrical device can have a metal substrate and an outer layer or coating. The self-healing polymer can be made from modified polymers including polyurethanes, polyureas, polyamides and polyesters. A preferred self-healing polymer is a modified polyurea material that includes a first monomer that has isocyanate function groups and a second monomer that has amine function groups. The modified polyurea material also can include one or more cross-linking agents and/or one or more catalysts. The linking agents can be triethyolamine (TEA) and tetra ethylene glycol (TEG) and the catalyst can be dibutyl tin diacetate. In a preferred embodiment, the molar ratio of TEA to the first monomer to TEG to the second monomer is 1:12: 6.8:4.

A cable tie fastener having an elongated body, a tail and a head that includes a locking mechanism can be made from, or at least the head and tail can be coated with, the self-healing polymer. A self-bonding tape, or at least one outer surface layer of the tape, can be made from the self-healing polymer, preferably a self-healing polymer that includes polyurethanes, polyureas, polyamides or polyesters.

Another embodiment is a conduit system that includes at least one conduit having an exterior surface and an interior surface and at least one fitting having an outer surface and an inner surface. The fitting receives the conduit so that the inner surface of the fitting contacts the exterior surface of the conduit. The conduit and the fitting are made from, or the exterior surface of the conduit and the inner surface of the fitting are coated with, the self-healing polymer, preferably a self-healing polymer that includes polyurethanes, polyureas, polyamides or polyesters.

An explosion-proof sealant material, which is installed inside a connector housing, can be made from the self-healing polymer, preferably a self-healing polymer that includes polyurethanes, polyureas, polyamides or polyesters.

A conduit or a fitting made from a polymer material can include an encapsulated material that includes the self-healing polymer, preferably a self-healing polymer that includes polyurethanes, polyureas, polyamides or polyesters.

BRIEF DESCRIPTION OF THE FIGURES

The preferred embodiments of the devices of the present invention made from or coated with a self-healing polymer, as well as other objects, features and advantages of this invention, will be apparent from the accompanying drawings wherein:

FIGS. 2A-B is an embodiment wherein the self-healing polymer is a tape.

FIGS. 3A-B is an embodiment wherein a cable fastener with a tapered locking mechanism is made from a self-healing polymer.

DETAILED DESCRIPTION OF THE INVENTION

Figure 1:
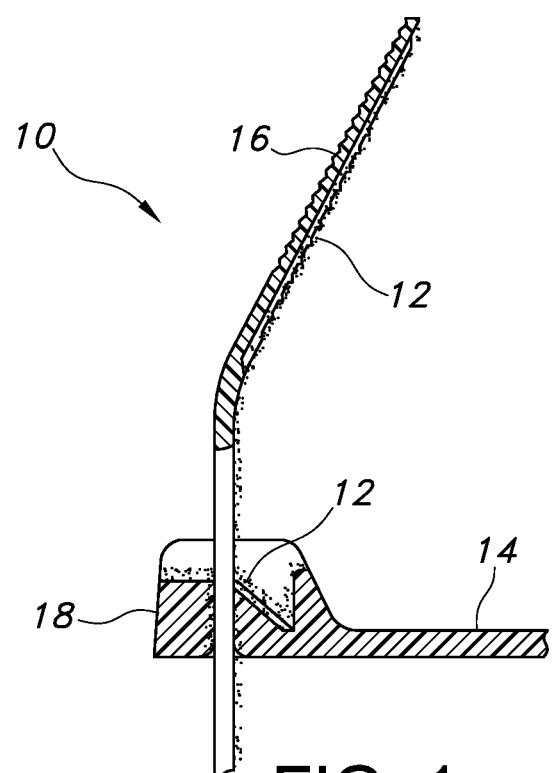
FIG. 1 is an embodiment wherein the self-healing polymer is used as a coating on the tail and locking mechanism of a cable tie.

The present invention is a self-healing polymer material used to make or coat electrical devices. The self-healable or self-bondable polymer material can be modified polyurethanes, polyureas, polyamides or polyesters. Preferably, the material is a permanently cross-linked poly(urea-urethane) elastomeric network that completely mends itself after being damaged or severed. In a preferred embodiment, a metathesis reaction of aromatic disulphides, which naturally exchange at room temperature, causes the regeneration. The modified polyurea material can be obtained through reaction of a first monomer that has isocyanate function groups and a second monomer that has amine function groups in the presence of cross-linking agents and a catalyst. The modified polyurea material is then used in for bonding, sealing or as a coating or processed into a device, e.g., a cable fastener (i.e., cable tie) or conduit connector. Different material compositions and/or processes may be used for different applications.

As used herein, the terms "self-healing" and "self-repairing" are defined as the ability of a material, preferably a polymer, to heal (i.e., recover/repair) damages automatically and autonomously, that is, without any external intervention. The terms are also used to describe polymers that bond together at temperatures above 40° F. when the surfaces are in contact and a minimal amount of pressure is applied—at least 1 psig.

The self-bonding action is based on the capability of the resulting polyurea polymer to reverse reaction back into the monomer forms. The forward reaction and the reverse reaction take place at the same time at the location of the small crack, thus re-structuring the material into a state that seals the crack. The dynamic balance of the forward reaction (polymerization) and the reverse reaction (disassociation) is designed in such a way that it provides the required self-bonding capability. The cable tie head is designed to maximize surface contact between the paw and the strap inside of the head when the cable tie is secured (used). The cable tie is held in place by the mechanical geometry of the paw-head configuration while the self-healing material on the contacting surfaces bond together. The cable tie becomes stronger and the structure of the cable tie becomes unified. This eliminates the small parts (e.g. the paw) when the cable tie breaks Eliminating the small parts provides advantages for many applications, e.g. cable ties used in the airplane industry.

In one embodiment, the first monomer is heamethylene diisocyanate and the second monomer is N,N'-di-tert-butylethylenediamine and the cross-link agents are triethyolamine (TEA) and tetra ethylene glycol (TEG). The molar ratio of TEA to the first monomer to TEG to the second monomer is 1:12:6.8:4. As one skilled in the art would understand, the ratio of components may change to provide self-healable polymers with different properties, such as bonding reaction time and the strength of the bond. The catalyst is preferably dibutyl tin diacetate. The resulting modified polyurea has at least a 1 MPa Young's modulus of elasticity. The modified polyurea material is then molded into a cable tie or used in a coating material. In a preferred embodiment, the modified polyurea material is mechanically ground into powders.

In another embodiment, a self-healing polyurethane elastomer is formed by synthesizing and reacting alkoxyamine-based diol with tri-functional homopolymer of hexamethylene diisocyanate (tri-HDI) and polyethylene glycol (PEG). The alkoxyamines act as crosslinkers of the resultant polyurethane so that the thermally reversible fission/recombination of C—ON bonds in alkoxyamine moieties enable repeated crosslinking and de-crosslinking of polyurethane chains at certain temperature. As a consequence, the polyurethane elastomer is self-healing. Testing of the polyurethane elastomer confirmed that the reversibly crosslinked polyurethane was capable of re-bonding ruptured parts and restoring mechanical strength. The self-healing characteristic of the polyurethane elastomer is a function of the molecular structures and compositions of the components, which can be adjusted as needed for different applications.

When the self-bondable material is used in a cable fastener it provides several advantages over prior art cable fasteners. The bonding of the locking mechanism eliminates the main weakness of cable ties, which typically fail when the locking mechanism fails. The self-bondable material also provides a more reliable cable fastener so that it is unnecessary to use multiple cable fasteners to assure a safety factor. In addition, cable fasteners made from the self-bondable material do not have loose ends that can be hazardous if they interfere with operating machinery.

The preferred self-healing polymers is a polyurea formulation that meets target performance needs in self-heal capability and other requirements in mechanical performance, thermal performance, flame resistance and process capability. Other self-healing polymer compositions can also be used, including those described in U.S. Pat. No. 6,527,849 to Dry, issued on Mar. 4, 2003; U.S. Pat. No. 6,548,763 to Kaltenborn et al., issued on Apr. 15, 2003; U.S. Pat. No. 7,041,331 to Lamola et al., issued on May 9, 2006; U.S. Pat. No. 7,108,914 to Skipor et al., issued on Sep. 19, 2006; U.S. Pat. No. 7,192,993 to Sarangapani et al., issued on Mar. 20, 2007; U.S. Pat. No. 7,285,306 to Parrish, issued on Oct. 23, 2007; U.S. Pat. No. 8,063,307 to Bukshpun et al., issued on Nov. 22, 2011; U.S. Patent Application Pub. No. US 2008/0152815 to Stephenson et al., published on Jun. 26, 2008, all of which are incorporated by reference in their entirety.

Alternate self-heal materials that can be used as coatings include micro-encapsulate self-heal material and pH value guided self-heal material. One micro-encapsulate self-heal material is based on epoxy resin and the healing agent and the catalyst are stored in micro capsules inside the material. When there is a crack that opens the micro encapsulate, the healing agent and the catalyst are released and react to polymerize into a solid that seals the crack. The pH value guided self-heal material is based on hydrogel material. The hydrogel is cross-linked through a chemical bond that can be reversed when the surrounding pH changes. When there is a crack, changing the environment pH value will allow the material to re-organize its polymer structure to seal the crack.

A preferred embodiment of the invention is directed to a polymeric cable fastener device (also referred to herein as a "cable tie") that, after it is wrapped and fastened together around a bundle of cables/wires with a locking mechanism, the locking mechanism fuses (or self-bonds) together. The invention includes the self-bonding polymeric material, the structure of the cable fastener devices and locking mechanism, and the manufacturing process that produces such products. The self-bonding polymer material allows two parts made of the same polymer to bind together, after the two parts are in surface contact for a period of time. The cable fastener devices are designed to include interlocking and/or interference fit locking mechanisms. These interlocking or interfering surfaces come into contact for a necessary length of time which initiates the self-bonding.

The self-healable polymeric material or polymeric coating is used to provide a reliable, permanent connection between cable fastener devices. It is intended to be permanent and non-removable. In the case of cable fastener devices, the entire device can be molded from the self-healable polymer or the device can be coated with the polymeric material.

The following concepts show distinctly different embodiments of self-bondable fastener devices that are made from a self-bondable polymer. The self-bondable polymer allows two parts made of, coated with or with an outer layer containing the polymer to bond together when held in surface to surface contact for a period of time at temperatures of at least 40° F., preferably at least 50° F. and most preferably at least 60° F. FIGS. 1 through 6 show several embodiments of the mating devices that engage in surface to surface contact and are securely interlocked when the self-bonding polymer on the surfaces bond together.

Concept #1

Polymeric Coating Application—In this embodiment as illustrated in FIG. 1, an existing cable fastener device 10 has particular surfaces 12 (i.e., the surfaces of the cable tie tail 16 and the locking mechanism 18 connected by a strap 14) or the entire device coated by the self-healable polymeric material as a secondary operation during the manufacturing process and prior to product shipment. When the cable tie 10 is used and the cable tie tail 16 is inserted in the locking mechanism 18, the coatings 12 bond together to secure the tail 16 in the locking mechanism 18.

Concept #2

Figure 2A:
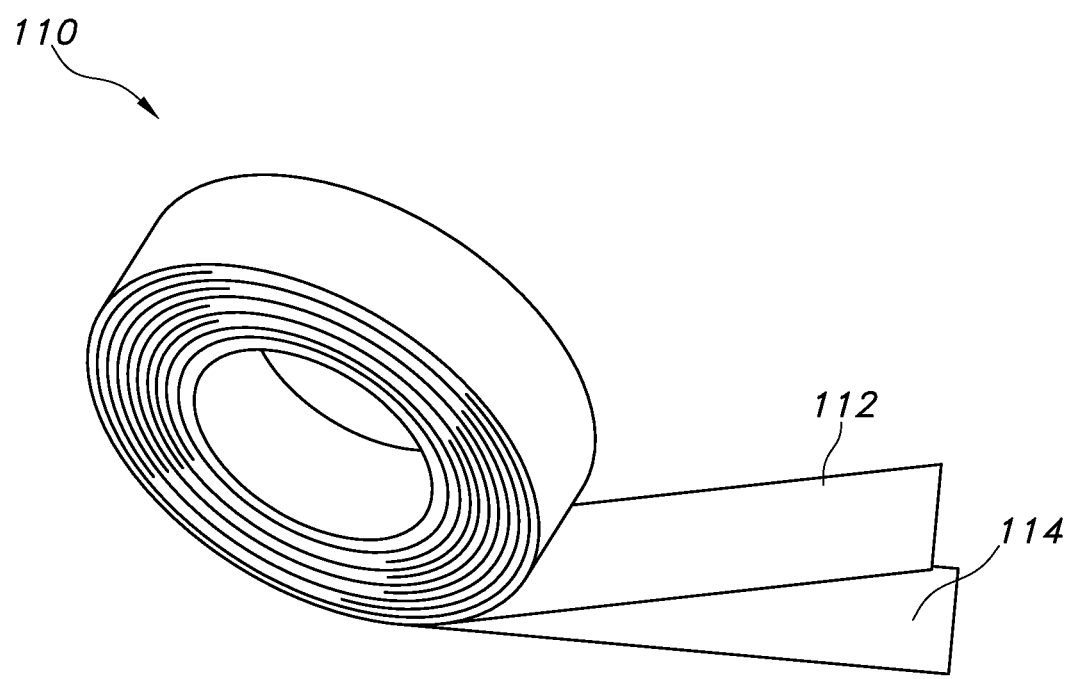

Self-Bondable Wiring Harness Tape—In this embodiment, rolls of tape 110 are made from the self-healable polymeric material 112. These rolls of tape 110 have a non-stick separator layer of material 114 inter-rolled (as shown in FIG. 2A) to prevent self-bonding before end customer application or use. Well known methods of applying the tape 110 can be used. After the separator layer 114 is removed, the self-bondable tape 110 can be wrapped around and over cable and/or wiring bundles 190 (as shown in FIG. 2B) with an overstretched, overlapping wrapping motion to impart an adequate amount of overlapping tape 112 surface area with enough friction/pressure between the sections so that self-bonding is initiated. After the tape 112 is wrapped around a surface 190 to protect or repair it, the self-healing function causes the overlapping tape wraps 112 to fuse together and create a more permanent repair. The adhesive coating 112 on the surface of the tape contains self-healing material that provides an initial bond until the wrapped materials "heal" together.

Concept #3

Figure 4A:
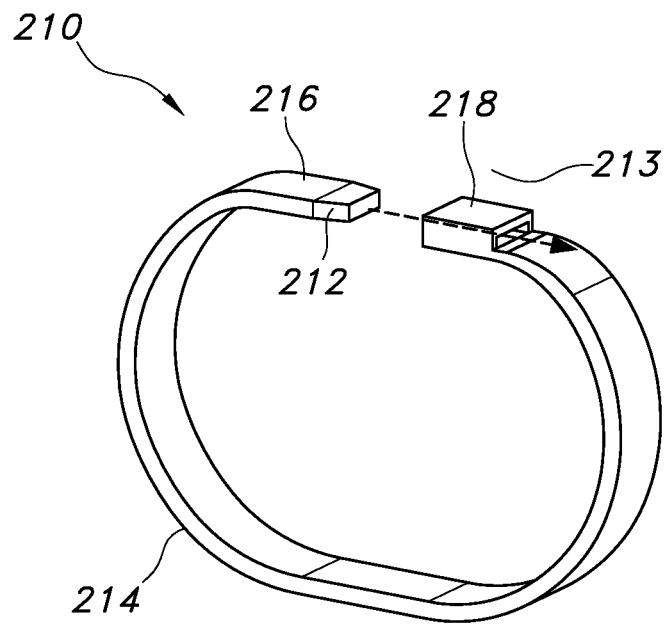
FIGS. 4A-B is an embodiment wherein a cable fastener with an interference-fit locking mechanism is made from the self-healing polymer.
Figure 4B:
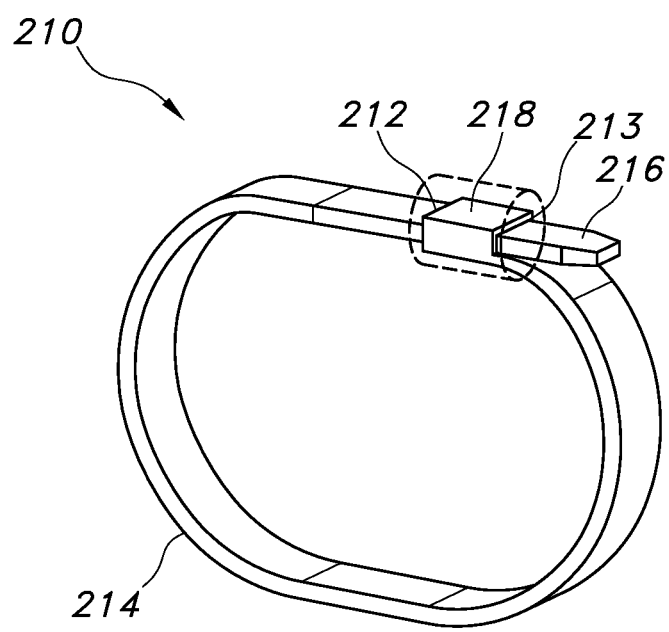

Cable Ties with Interference Fit Heads—In this embodiment, cable tie fastening devices 210 are manufactured from the self-healable polymeric material 212 using standard molding processes. FIG. 3A shows a typical cable tie 210 with a predefined strap 214 thickness. The cable tie head 218 design includes an interference fit design, as shown in FIG. 3B, that incorporates a tapered passage 213 and interior surface textures to provide the interference fit when the cable tie tail 216 is inserted in the cable tie head 218. FIG. 4A shows how the interference fit takes place as the tail 216 of the cable tie is inserted and pulled through the tapered passage 213 in the head 218 of the cable tie 210 (i.e., locking mechanism). As the tail 216 of the cable tie 210 moves through the passage 213, the height of the passage 213 decreases, which induces a pre-tension between the head's tapered interior surfaces of the passage 213 and the opposing surfaces of the tail 216. FIG. 4B illustrates how, after the cable tie 210 is fastened around the respective wiring bundle, the self-bonding is initiated, which joins the strap 214 and head 218 into one solid piece.

Concept #4

Figure 5A:
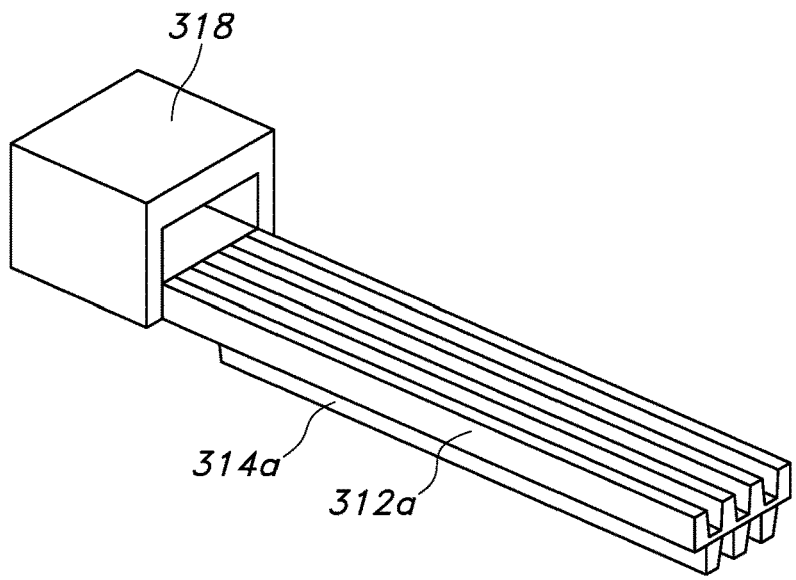
FIGS. 5A-C is an embodiment wherein a cable fastener is made from the self-healing polymer and the ends have irregular geometric surfaces.
Figure 5B:
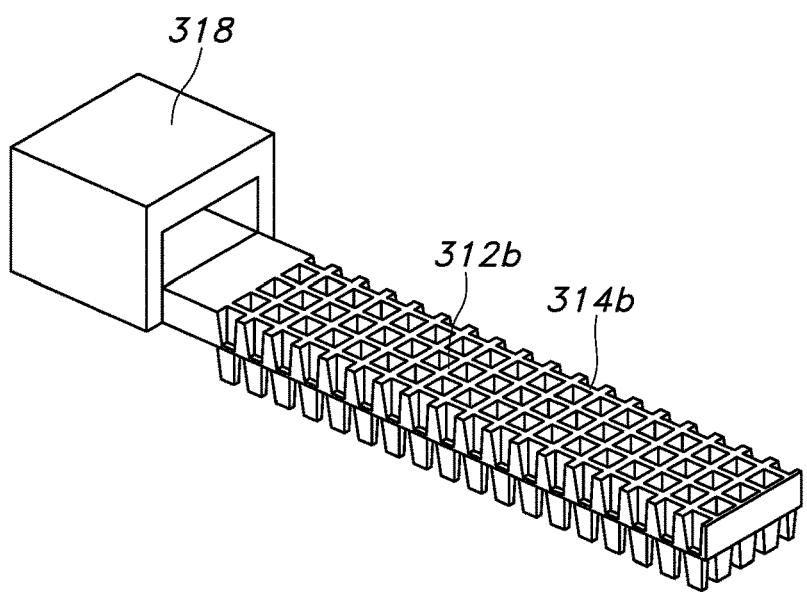
Figure 5C:
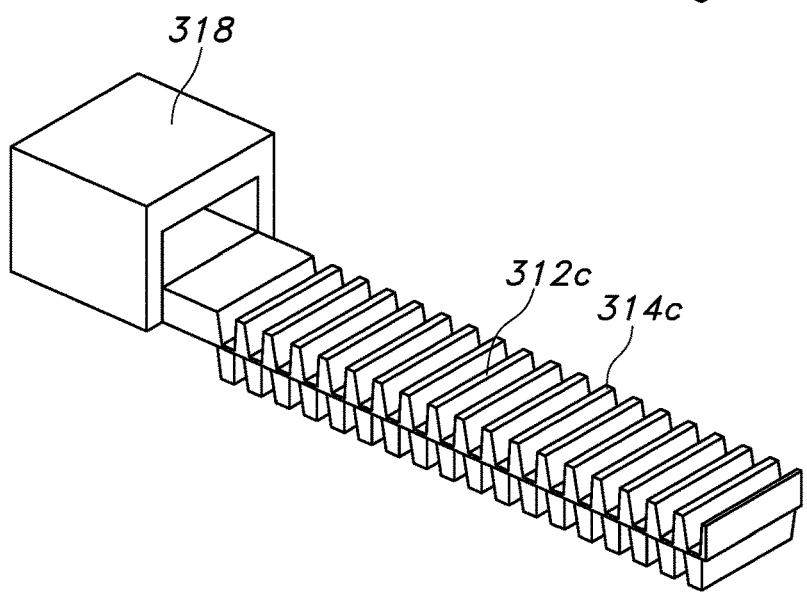
Figure 6:
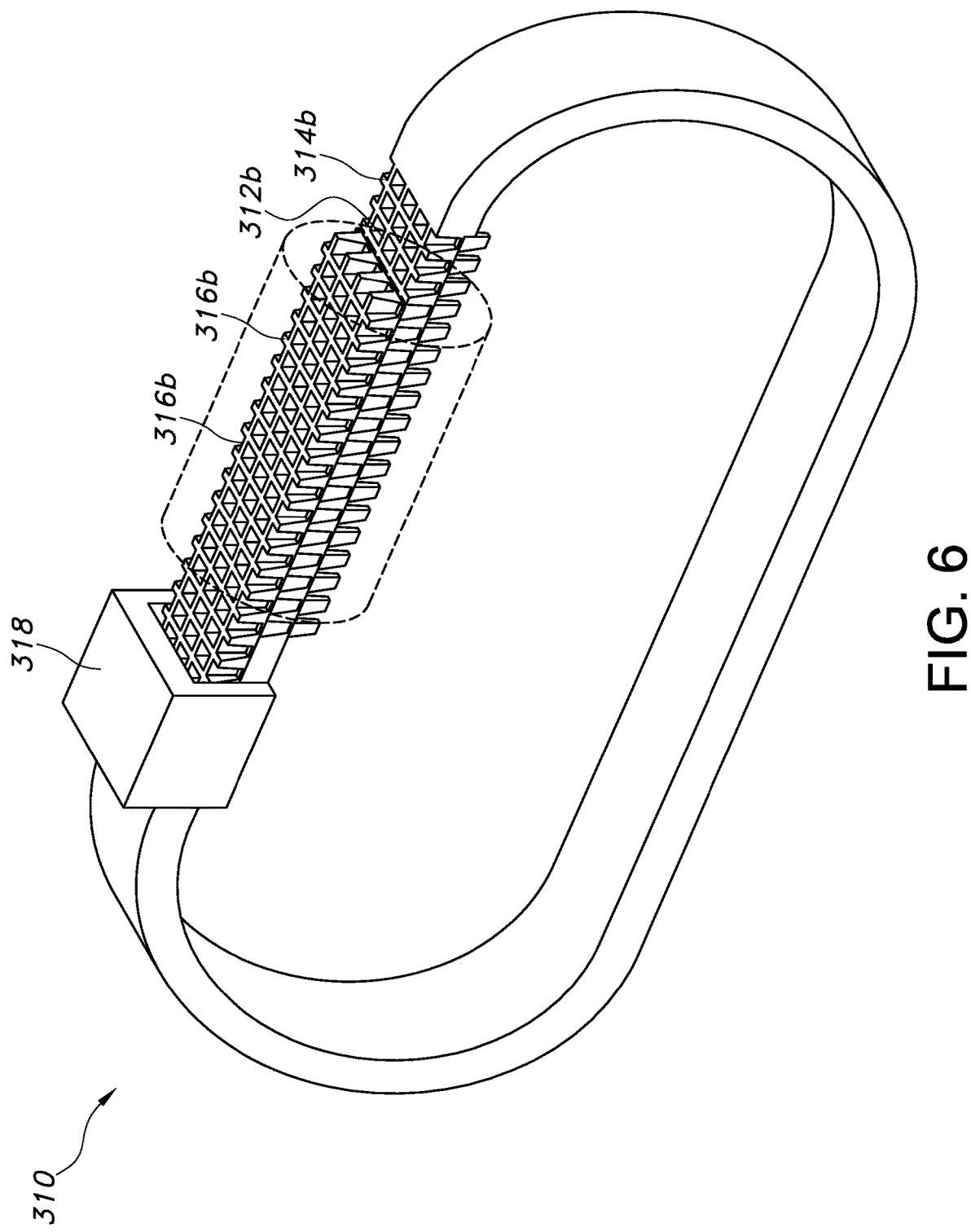
FIG. 6 is the cable fastener shown in FIG. 5B with overlapping ends having irregular geometric surfaces.

Cable Ties with Interlocking Strap having irregular surface geometries—In this embodiment, cable tie fastening devices 310 having irregular (or complex) surface geometries 312 a-c are made from self-healable polymeric material using standard molding practices. FIGS. 5A-C show examples of interlocking straps 314a-c having irregular surface geometries 312a-c that are intended to increase the overall surface area. The interlocking geometric surfaces 312a-c are in contact under friction/pressure loading along a certain length of the interlocking strap 314a-c and the polymers react to bond the tail of the cable tie 310 to the locking mechanism 318. FIG. 6 shows the bonded portion of the strap 314b after the tail end 316 is inserted/pulled through the cable tie head 318 (locking mechanism). Self-bonding begins when the geometric interlocking surfaces 312b come into contact under pressure.

Figure 7:
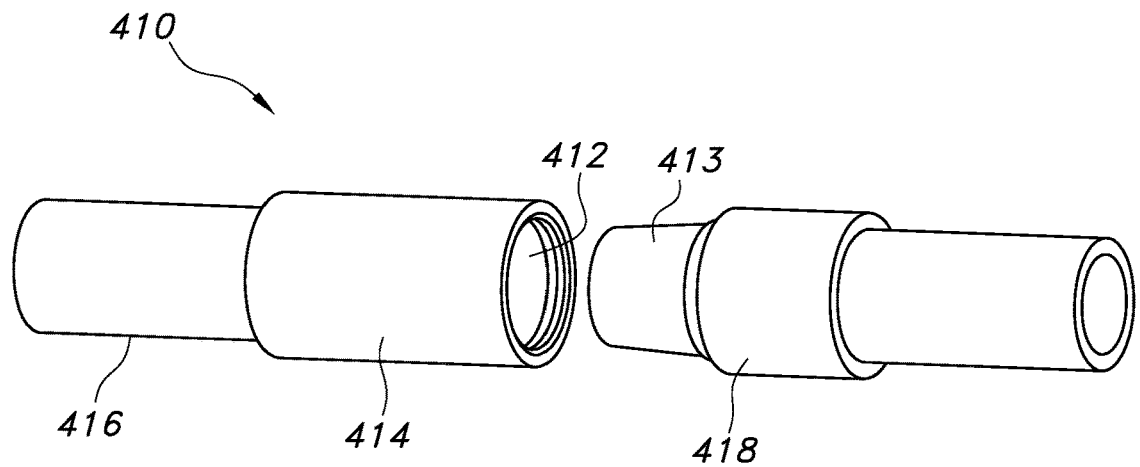
FIG. 7 is an embodiment wherein the self-healing polymer is used as a joint sleeve on conduits and fittings.
Figure 8:
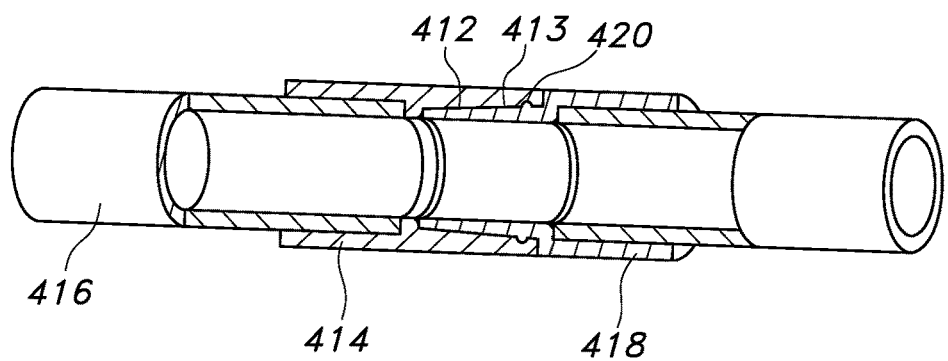
FIG. 8 shows the conduit and fitting in FIG. 7 after they are connected.

FIGS. 7-11 show the self-healable polymers or polymeric coatings used to provide a reliable permanent connection 410 for conduits and fittings. The bond is intended to be permanent and non-removable. In the case of non-metallic conduit, the entire length of conduit and the fittings can be manufactured by molding or extruding the self-healable polymer. In the case of conduits and fittings that are both the metallic and non-metallic, a self-healable polymeric coating can be applied to the mating surfaces of the connection areas during the manufacture of the conduit and fittings. As shown in FIGS. 7 and 8, when a fitting 414 is installed on a conduit 416, 418, the self-healable polymers 412, 413 on the adjoining surfaces bond together to form a sealed connection. This eliminates the need for solvents and adhesives that are currently used to join non-metallic conduits and fittings. The conduit 418 can also be provided with a snap fit 420 (see FIG. 8) for holding the coupling 414 on the conduit 418 while the seal forms.

Alternate constructions include straight fit, taper fit and snap-fit connections. It is also possible to use the coating on threads as well as to create a permanent bond (see FIG. 12). The conduit fittings can be press-fit or threaded together. The use of self-healing material provides for a sealed connection that is long term and strong. Fittings bond together and will not loosen.

Figure 9:
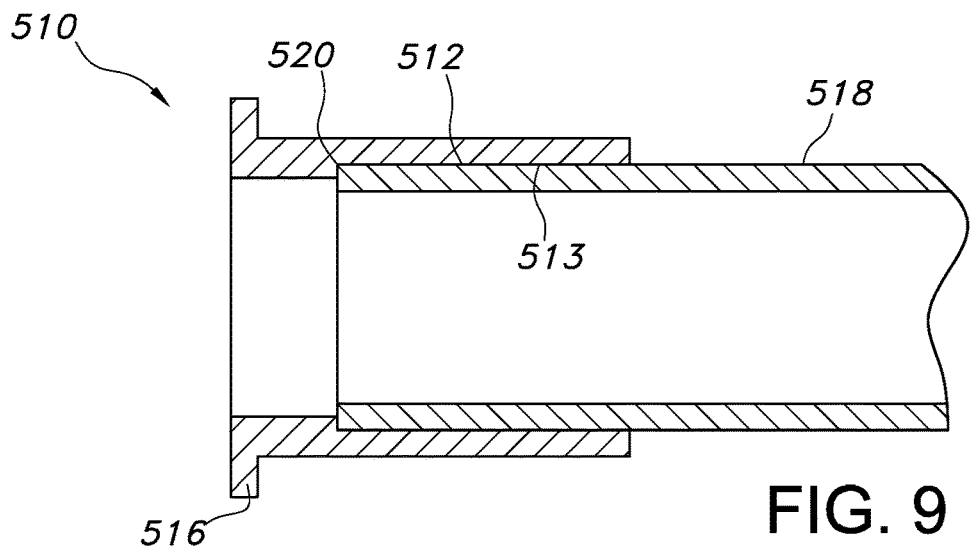
FIG. 9 is a cross-sectional view of a conduit connected to a stub connector.
Figure 10:
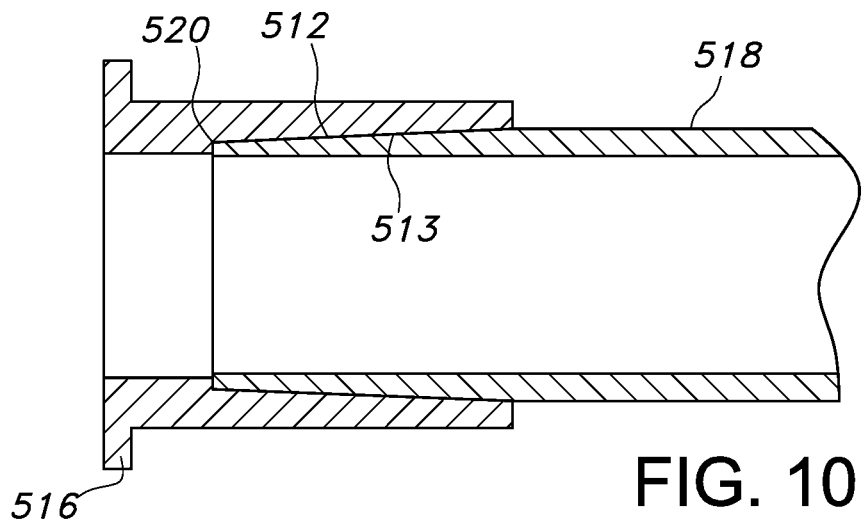
FIG. 10 is a cross-sectional view of a conduit with a tapered end connected to a stub connector.

The intended concept includes electrical conduits and fittings that have self-healable surface coatings and the corresponding coating method. The electrical devices include metallic conduits and fittings that are coated with polymeric material on their interior and exterior surfaces. The polymeric coating materials are able to independently repair small surface cracks caused by transportation, installation, and operation of the conduit or fitting device. The coating materials also provide protection for the metallic conduit or fitting against corrosion and impact. FIGS. 9 and 10 show a connection 510 wherein a conduit 518 is inserted into a fitting 516 with an insertion stop 520 that limits how far the conduit 518 can be inserted into the fitting 516. Self-healing polymer on the interior surface 512 of the fitting 516 contacts the self-healing polymer on the exterior surface 513 of the conduit 518 and the self-healing polymers bond together to form a permanent connection. In FIG. 10, the conduit 518 is tapered and the interior diameter of the fitting 516 increases towards the open end to provide a compression fit between the conduit 518 and the fitting 516.

Figure 11:
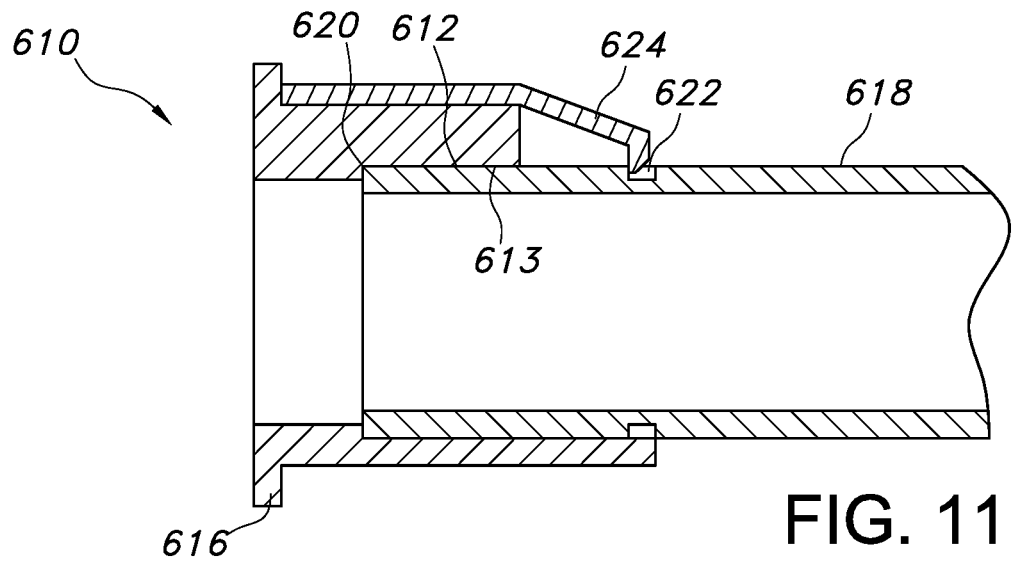
FIG. 11 is a cross-sectional view of the conduit with a retainer clip connected to a stub connector.

FIG. 11 shows a connection 610 wherein a conduit 618 is connected to a fitting 616 with an insertion stop 620, wherein the fitting 616 is provided with a member 624 the engages a groove 622 in the conduit 618 to provide a snap feature. After the conduit 618 is inserted in the fitting 616, the self-healing polymer on the interior surface 612 of the fitting 616 contacts the self-healing polymer on the exterior surface 613 of the conduit 618. The snap feature secures the conduit 618 in the fitting 616 while the self-healing polymers on the surfaces 612, 613 bond together to permanently connect the conduit 618 and the fitting 616.

The invention is directed to electrical devices made from or coated with polymeric coating materials that automatically repair small cracks and cuts and the methods of making and coating these devices. The coating materials provide several advantages. The self-heal or self-repair capability of the polymers can self-repair small cracks and cuts multiple times over a period of several years. The modified polyurea thermoset coating material is recyclable and, therefore, more environmentally friendly. The polymers also reduce the maintenance cost for the conduit and/or fittings. The self-healable coating materials are corrosion resistant, thermally stable, flame retardant, provide electrical insulation, mechanically strengthen the conduits and fittings and are easy to process.

In another embodiment, the self-healable polymers are used as a sealant material that can be applied at a low temperature to a fitting, such as an electrical fitting. The polymeric sealant material is in a powder form with the powder particles mixed with polymers to form a bulk material. The bulk material is installed in a fitting and acts as a sealant to prevent hazardous liquid or gaseous leaks through the fitting in an explosion hazardous location. The formed sealant material can also self-heal micro cracks. The sealant material can form a functional sealant at temperatures as low as 0° C. or below with proper mechanical compression for a fitting such as an electrical fitting.

The low temperature polymeric sealant material can be a modified polyurea material that is formed by reacting a monomer with isocyanate function groups and a monomer with amine function groups in the presence of cross-linking agents and a catalyst. The modified polyurea material is then reduced to a powder form. The powder material is applied to a fitting that is connected to a cable or conduit. The powder residing in the fitting space receives is activated by the mechanical compression when the fitting is fastened. The compressed modified polyurea powder particles form a bulk material that forms a seal. The integrated sealant material can self-heal micro crack experienced during its life.

Figure 12:
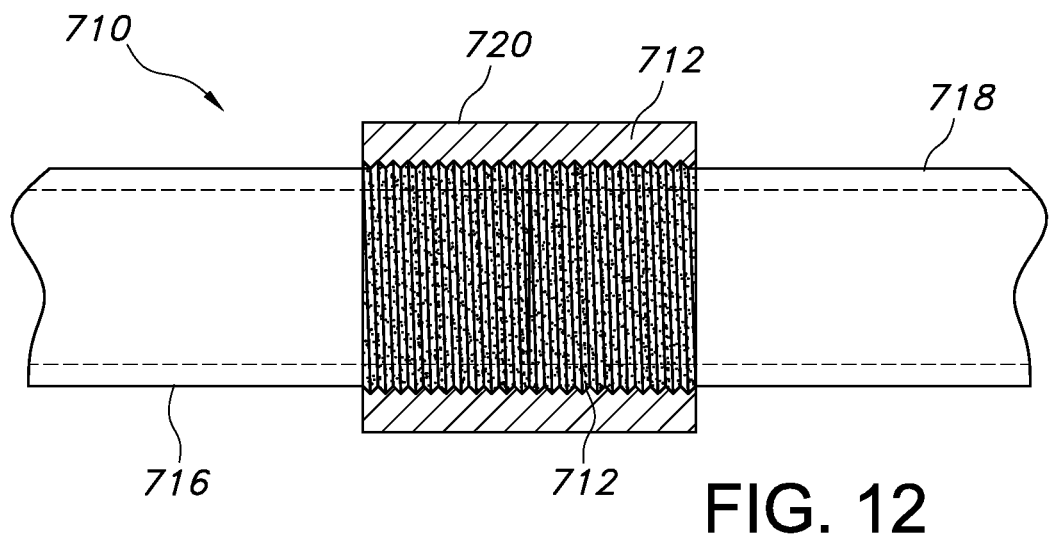
FIG. 12 shows a connector that uses a self-healing material as sealant medium.
Figure 13A:
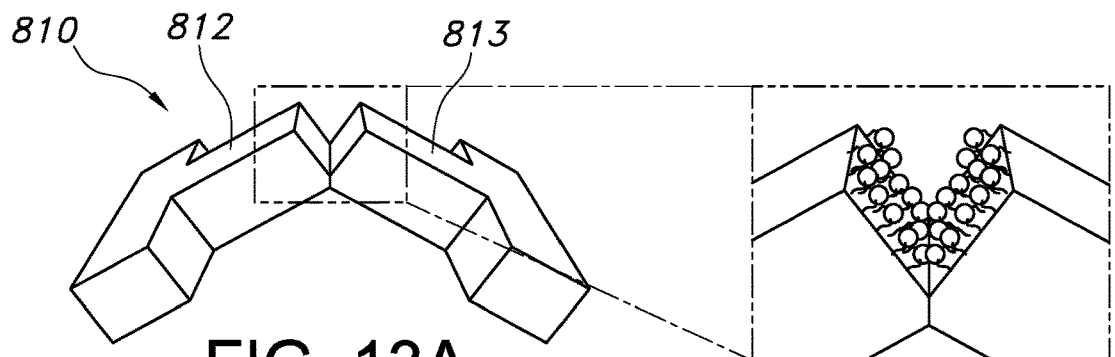
FIG. 13A-D show the steps as a cut in a self-healing polymer heals.
Figure 13B:
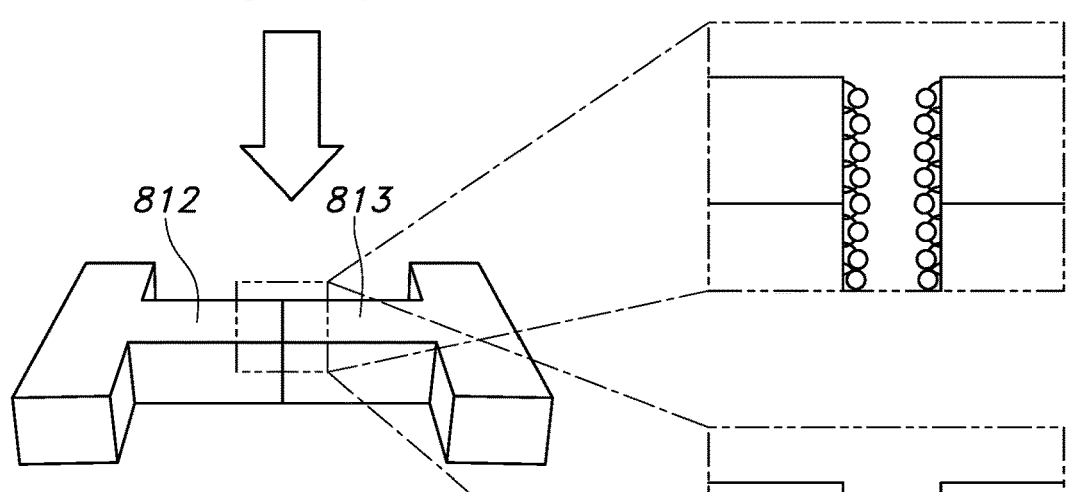
Figure 13C:
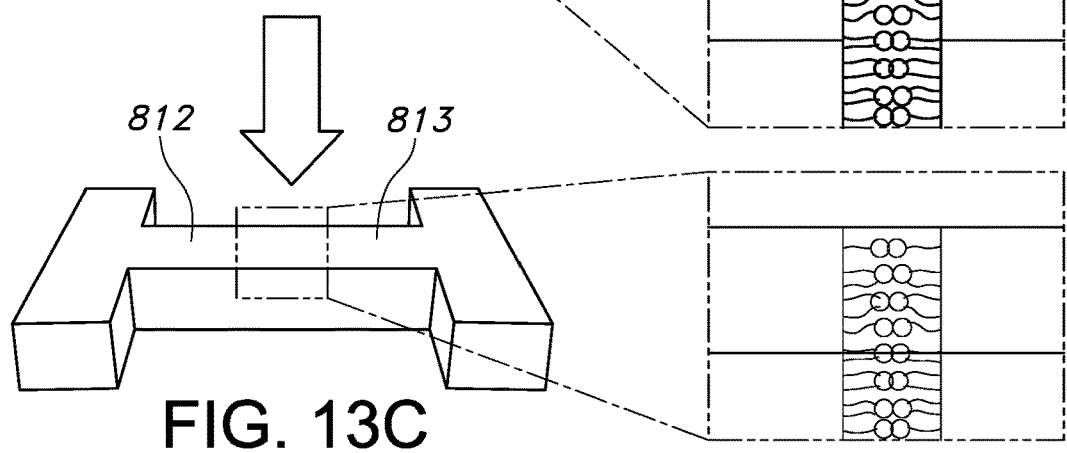
Figure 13D:
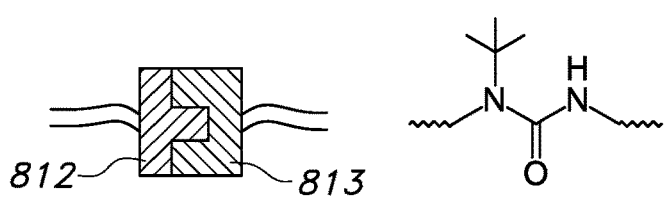

The self-healable polymer powder 712 is applied to a connection 710 as illustrated in FIG. 12, which shows two conduits 716, 718 connected by a coupling 720. The self-healing material 712 is applied to the threads of the conduits 716, 718 and/or the interior threads of the coupling 720. When the coupling 720 is tightened, the self-healing material 712 compresses and forms a bond between the conduits 716, 718 and the coupling 720. The self-healing material 712 fills the gap region between the conduits 716, 718 and the coupling 720.

The self-healing material can be formed from a modified polyurea and used as a sealant material in a fitting. After the sealant is used to fill the space inside a fitting, a nut is screwed against the fitting assembly to fasten the connection and squeeze the polyurea powder. The compressed polyurea powders are then integrated into a block of material that seals the connection. The integrated sealant can also self-heal micro cracks that can occur during operation of the device. The advantages of such low temperature sealant material include: (1) lower temperature formation of sealant material; (2) self-healing of the sealant material from micro cracks; and (3) lower installation cost.

The low temperature integration ability of the powder particles and the self-heal ability of the bulk material 810 are based on the capability of the modified polyurea polymer to reverse reaction back into its monomer forms after cut or separated into two portions 812, 813, as illustrated in FIGS. 13A-D. The forward reaction and the reverse reaction take place at the same time at the site of the powder particle contact or the location of the small crack; thus, re-structuring the material into a state that either integrates adjacent powder particles or seals the crack. The dynamic balance of the forward reaction (polymerization) and the reverse reaction (disassociation) is designed in such a way that adjacent polyurea parts are integrated.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. An electrical device comprising:
 a substrate made from or a metal or non-metal, the substrate having a first part and a second part, the first part being selectively displaceable relative to the second part; and
 an outer layer or coating positioned on the substrate, the outer layer or coating comprising a self-healing polymer, a first section of the self-healing polymer being positioned on the first part and a second section of the self-healing polymer being positioned on the second part at a location at which, upon selective displacement of the first part, the first section contacts, and securely self-bonds with, the second section.

2. The electrical device according to claim 1, wherein the self-healing polymer is modified polyurethanes, polyureas, polyamides or polyesters.

3. The electrical device according to claim 2, wherein the self-healing polymer is modified polyurea material comprising a first monomer that has isocyanate function groups and a second monomer that has amine function groups.

4. The electrical device according to claim 2, wherein the modified polyurea material further comprises a cross-linking agent and/or a catalyst.

5. The electrical device according to claim 1, wherein the modified polyurea material further comprises triethyolamine (TEA) and tetra ethylene glycol (TEG) as cross-linking agents and dibutyl tin diacetate as a catalyst.

6. The electrical device according to claim 5, wherein the molar ratio of TEA to the first monomer to TEG to the second monomer is 1:12:6.8:4.

* * * * *